(12) United States Patent
Chen et al.

(10) Patent No.: US 10,797,063 B2
(45) Date of Patent: Oct. 6, 2020

(54) SINGLE-POLY NONVOLATILE MEMORY UNIT

(71) Applicant: eMemory Technology Inc., Hsin-Chu (TW)

(72) Inventors: Hsueh-Wei Chen, Hsinchu County (TW); Wei-Ren Chen, Hsinchu County (TW); Wein-Town Sun, Hsinchu County (TW); Jui-Ming Kuo, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 29 days.

(21) Appl. No.: 16/231,956

(22) Filed: Dec. 25, 2018

(65) Prior Publication Data

US 2019/0214401 A1 Jul. 11, 2019

Related U.S. Application Data

(60) Provisional application No. 62/615,463, filed on Jan. 10, 2018.

(30) Foreign Application Priority Data

Nov. 27, 2018 (TW) .............................. 107142272 A

(51) Int. Cl.
*G11C 5/06* (2006.01)
*H01L 27/11558* (2017.01)
(Continued)

(52) U.S. Cl.
CPC .... *H01L 27/11558* (2013.01); *G11C 16/0433* (2013.01); *G11C 16/10* (2013.01);
(Continued)

(58) Field of Classification Search
CPC ......... H01L 27/11558; H01L 27/11519; H01L 27/11524; H01L 29/0649; H01L 29/42328;
(Continued)

(56) References Cited

U.S. PATENT DOCUMENTS 5,777,361 A * 7/1998 Parris .................. H01L 29/7885
257/322
7,796,450 B1 * 9/2010 Pesavento .......... G11C 16/0458
365/185.21

(Continued)

FOREIGN PATENT DOCUMENTS

JP 2005-243127 A 9/2005
JP 2005-532654 A 10/2005
(Continued)

*Primary Examiner* — Viet Q Nguyen
(74) *Attorney, Agent, or Firm* — Winston Hsu

(57) ABSTRACT

A single-poly non-volatile memory unit includes: a semiconductor substrate having a first conductivity type; first, second and third OD regions disposed on the semiconductor substrate and separated from each other by an isolation region, wherein the first OD region and the second OD region are formed in a first ion well, and the first ion well has a second conductivity type; a first memory cell disposed on the first OD region, a second memory cell disposed on the second OD region. The first memory cell and the second memory cell exhibit an asymmetric memory cell layout structure with respect to an axis. An erase gate is disposed in the third OD region.

26 Claims, 7 Drawing Sheets

(51) Int. Cl.
*H01L 27/11524* (2017.01)
*H01L 29/06* (2006.01)
*H01L 29/423* (2006.01)
*G11C 16/26* (2006.01)
*H01L 29/788* (2006.01)
*G11C 16/04* (2006.01)
*G11C 16/14* (2006.01)
*G11C 16/10* (2006.01)
*H01L 27/11519* (2017.01)

(52) U.S. Cl.
CPC .............. *G11C 16/14* (2013.01); *G11C 16/26* (2013.01); *H01L 27/11519* (2013.01); *H01L 27/11524* (2013.01); *H01L 29/0649* (2013.01); *H01L 29/42328* (2013.01); *H01L 29/7885* (2013.01); *G11C 16/0483* (2013.01); *G11C 2216/04* (2013.01); *G11C 2216/10* (2013.01)

(58) Field of Classification Search
CPC ........... H01L 29/7885; G11C 16/0433; G11C 16/10; G11C 16/14; G11C 16/26
USPC ...................................................... 365/185.18
See application file for complete search history.

(56) References Cited

U.S. PATENT DOCUMENTS

| | | | | |
|---|---|---|---|---|
| 7,800,156 | B2* | 9/2010 | Roizin | G11C 16/10 |
| | | | | 257/315 |
| 9,368,161 | B2* | 6/2016 | Tsao | H01L 27/11558 |
| 9,391,083 | B2* | 7/2016 | Hsu | G11C 5/147 |
| 9,892,928 | B2* | 2/2018 | Li | H01L 29/788 |
| 10,083,003 | B2* | 9/2018 | Park | G06F 3/038 |
| 10,083,757 | B2* | 9/2018 | Chen | H01L 29/7881 |
| 10,083,976 | B2* | 9/2018 | Hsu | H03K 19/088 |
| 10,103,157 | B2* | 10/2018 | Li | G11C 16/12 |
| 10,115,682 | B2* | 10/2018 | Li | H01L 27/0883 |
| 2009/0124054 | A1* | 5/2009 | Liu | G11C 16/0416 |
| | | | | 438/257 |
| 2009/0212342 | A1* | 8/2009 | Roizin | G11C 16/10 |
| | | | | 257/316 |
| 2009/0213660 | A1* | 8/2009 | Pikhay | G11C 16/0441 |
| | | | | 365/185.18 |
| 2009/0225601 | A1 | 9/2009 | Shih | |
| 2010/0165698 | A1* | 7/2010 | Liu | G11C 16/0441 |
| | | | | 365/94 |
| 2015/0054043 | A1 | 2/2015 | Tan | |
| 2017/0110195 | A1 | 4/2017 | Chen | |

FOREIGN PATENT DOCUMENTS

| | | |
|---|---|---|
| JP | 2016-532292 A | 10/2016 |
| TW | 200845309 | 11/2008 |
| TW | I582959 B | 5/2017 |
| TW | 201725706 A | 7/2017 |

* cited by examiner

| Operational mode | $V_{SL}$ | $V_{SG}$ | $V_{BL1}$ | $V_{BL2}$ | $V_{NW}$ | $V_{EL}$ | $V_{PW}$ | Mechanism |
|---|---|---|---|---|---|---|---|---|
| Program ($C_1/C_2$) | $V_{PP}$ | $0\sim V_{DD}$ | 0 | 0 | $V_{PP}$ | $0\sim V_{DD}$ | 0 | CHE |
| Erase | 0 | 0 | 0 | 0 | 0 | $0\sim V_{EE}$ | 0 | FN |
| Negative erase | $V_{BB}$ | $0\sim(V_{BB}-V_t)$ | $V_{BB}$ | $V_{BB}$ | 0 | $0\sim V_{EE}$ | 0 | FN |
| Read | $V_{read}$ | 0 | 0 | 0 | $V_{read}$ | 0 | 0 | |
| $0<V_{DD}<V_{PP}$, $-V_{EE}<V_{BB}<0$, $V_{read}<V_{DD}$, $0<V_{DD}<V_{EE}$ |||||||||

FIG. 5

SINGLE-POLY NONVOLATILE MEMORY UNIT

CROSS REFERENCE TO RELATED APPLICATIONS

This application claims priority from U.S. provisional application Ser. No. 62/615,463 filed Jan. 10, 2018, the subject matter of which is hereby incorporated by reference.

BACKGROUND OF THE INVENTION

1. Field of the Invention

The present invention relates to a single-poly non-volatile memory (NVM) unit, and more particularly to a single-poly, multi-time programmable (MTP) memory unit having an asymmetric memory cell layout structure.

2. Description of the Prior Art

Non-volatile memory (NVM) is widely used in a variety of electronic devices because it retains stored information even when there is no power supply. Non-volatile memory is divided into multi-time programmable (MTP) memory and one-time programmable (OTP) memory, depending on the number of programming cycles. MTP is readable and writable multiple times. Typically, MTP has a single charge storage area for writing and reading information, i.e., 1 cell/bit.

Conventionally, a NVM unit includes a floating gate transistor for storing charges such as electrons, and one or two select transistors for enabling the floating gate transistor to perform corresponding operations. The floating gate can be controlled by coupling elements for programming and erase operations. The state of the transistor is defined by the charge trapped at the floating gate.

An important property of non-volatile memory is data retention, which is defined as the time at which written information persists to a floating gate for a sufficient degree. Typically, the leakage current that causes charge to disappear from the floating gate should be as small as the memory can remain in use for several years (e.g., ten years) without rewriting.

However, the size of the components continues to shrink, making the gate oxide layer thinner and thinner. Due to the tunneling effect of electrons from the floating gate to the substrate, a thin gate oxide layer can degrade the charge loss at the floating gate. Repeated programming (PGM)/erase (ERS) operations can also degrade the reliability of the memory. As the number of rewrite cycles increases beyond a certain limit, the difference between the programmed and erased states will become too small to be recognized, resulting in an endurance failure.

It is known that the design of single-poly NVMs can reduce additional process costs. Single-poly NVMs form a charge-storing floating gate with a single layer of polysilicon. Because single-poly NVMs are compatible with standard CMOS processes, it is commonly used in embedded memory, mixed mode circuits, and embedded non-volatile memory in microcontrollers such as system-on-a-chip (SOC).

Programming of memory cells can be accomplished by hot electron injection techniques (also known as channel hot electron injection), and memory cells can be erased via Fowler-Nordheim (FN) tunneling of the erase gate. Generally, in order to achieve better erasing performance, a larger memory cell size is required to obtain a higher coupling ratio. In addition, prior art MTP memories require a large operation window to cover reference current variations, which also limits the likelihood that the size of the memory cells will be further reduced.

SUMMARY OF THE INVENTION

It is one object of the present invention to provide an improved single-poly non-volatile memory (NVM) unit having an asymmetric cell layout structure that can solve the prior art deficiencies and shortcomings.

According to an embodiment of the invention, a single-poly non-volatile memory unit includes: a semiconductor substrate having a first conductivity type; first, second and third OD regions disposed on the semiconductor substrate and separated from each other by an isolation region, wherein the first OD region and the second OD region are formed in a first ion well, and the first ion well has a second conductivity type; a first memory cell disposed on the first OD region, a second memory cell disposed on the second OD region. The first memory cell and the second memory cell exhibit an asymmetric memory cell layout structure with respect to an axis. An erase gate is disposed in the third OD region.

According to an embodiment of the invention, the first OD region and the second OD region are parallel to each other and extend along a first direction, and the third OD region extends along a second direction. The third OD region is formed in a second ion well and the second ion well has the first conductivity type (e.g., P type).

According to an embodiment of the invention, the first memory cell comprises a first select transistor and a first floating gate transistor connected in series with each other, which are disposed on the first OD region. The second memory cell comprises a second select transistor and a second floating gate transistor connected in series with each other, which are disposed on the second OD region.

According to an embodiment of the invention, the first select transistor comprises a first source doping region, a first common doping region, and a select gate, wherein the first source doping region and the first common doping region have the first conductivity type, wherein the first floating gate transistor comprises the first common doping region, a first drain doping region, and a first floating gate.

According to an embodiment of the invention, the second select transistor comprises a second source doping region, a second common doping region, and the select gate, wherein the second source doping region and the second common doping region have the first conductivity type, wherein the second floating gate transistor comprises the second common doping region, a second drain doping region, and a second floating gate.

According to an embodiment of the invention, the first source doping region is merged with the second source doping region and/or the first common doping region is merged with the second common doping region.

According to an embodiment of the invention, the first floating gate has a first channel width in the second direction, and the second floating gate has a second channel width in the second direction, wherein the second channel width is smaller than the first channel width.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 5 illustrates an operational condition table for programming, erasing or reading the single-poly NVM unit 1 of FIG. 1 in accordance with an embodiment of the present invention;

DETAILED DESCRIPTION

Figure 1:
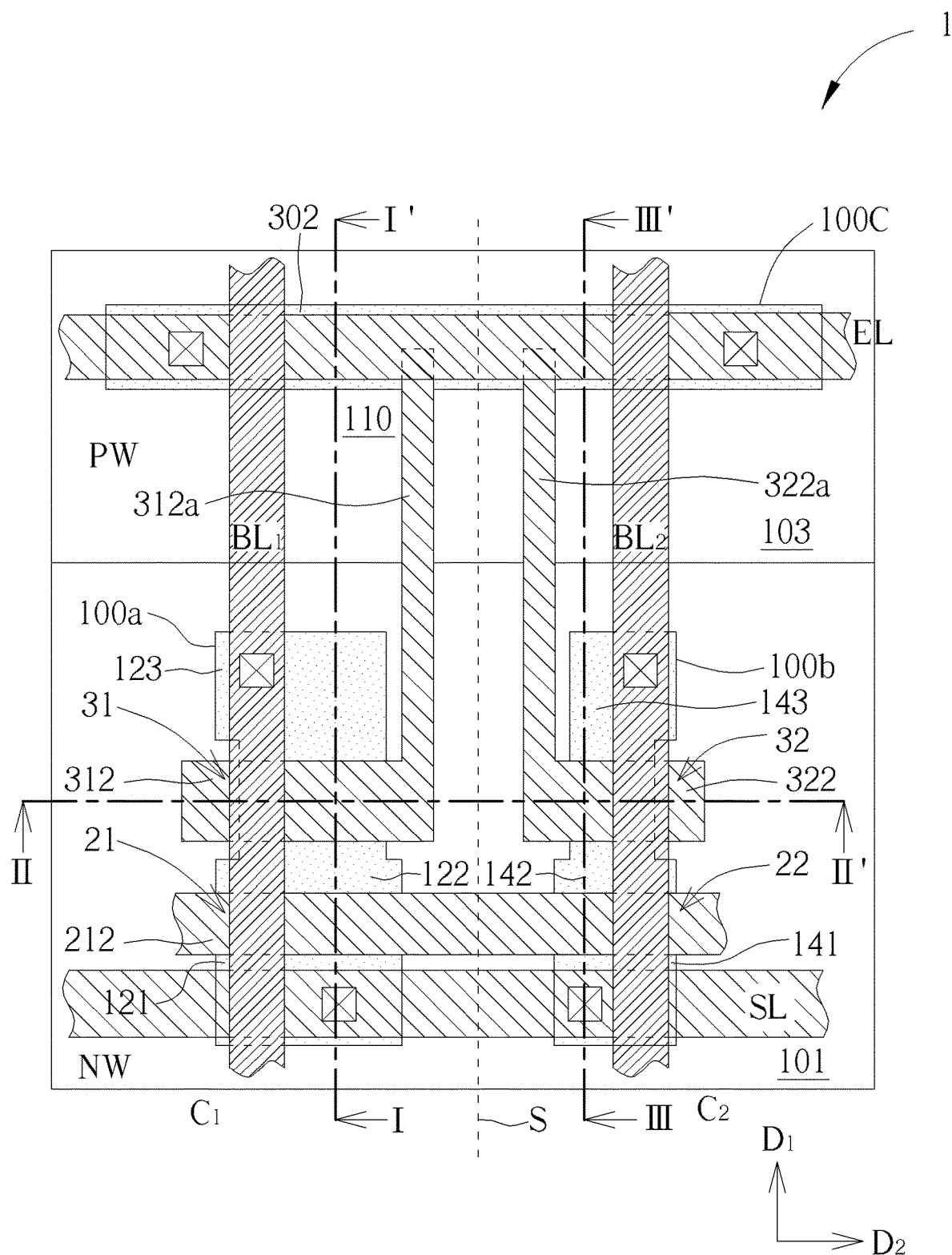
FIG. 1 is an exemplary layout diagram illustrating a single-poly non-volatile memory (NVM) unit according to an embodiment of the invention.

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

The invention relates to an improved single-layer non-volatile memory (NVM) unit with an asymmetric memory cell layout structure, which can be used as a multi-time programmable (MTP) memory unit. Hereinafter, although a two-cell per bit NVM unit is taken as an example, those skilled in the art should understand that the present invention can be applied to multi-cell per bit NVM units. It will be appreciated that although some conductivity types have been used for illustrative purposes, the invention may be practiced with opposite conductivity types.

Figure 2:
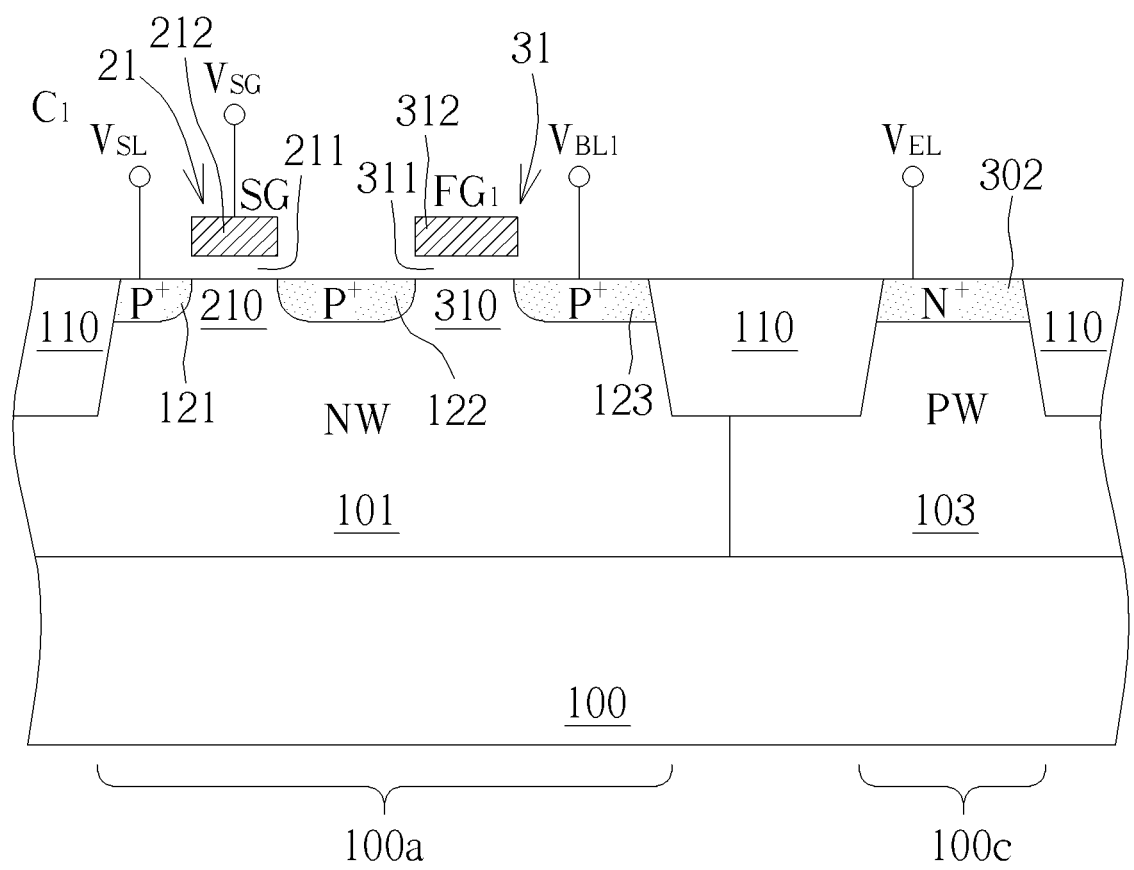
FIG. 2 is a schematic, cross-sectional view taken along line I-I' in FIG. 1.
Figure 3:
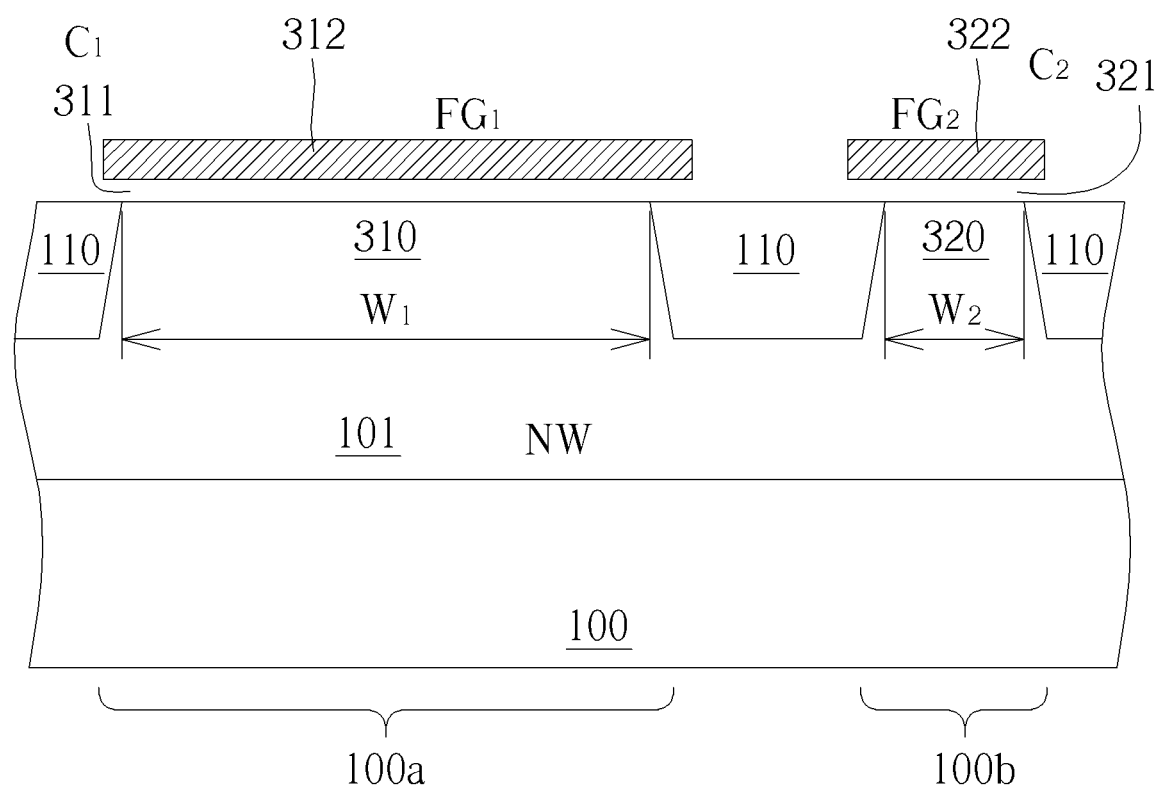
FIG. 3 is a schematic, cross-sectional view taken along line II-II' in FIG. 1.
Figure 4:
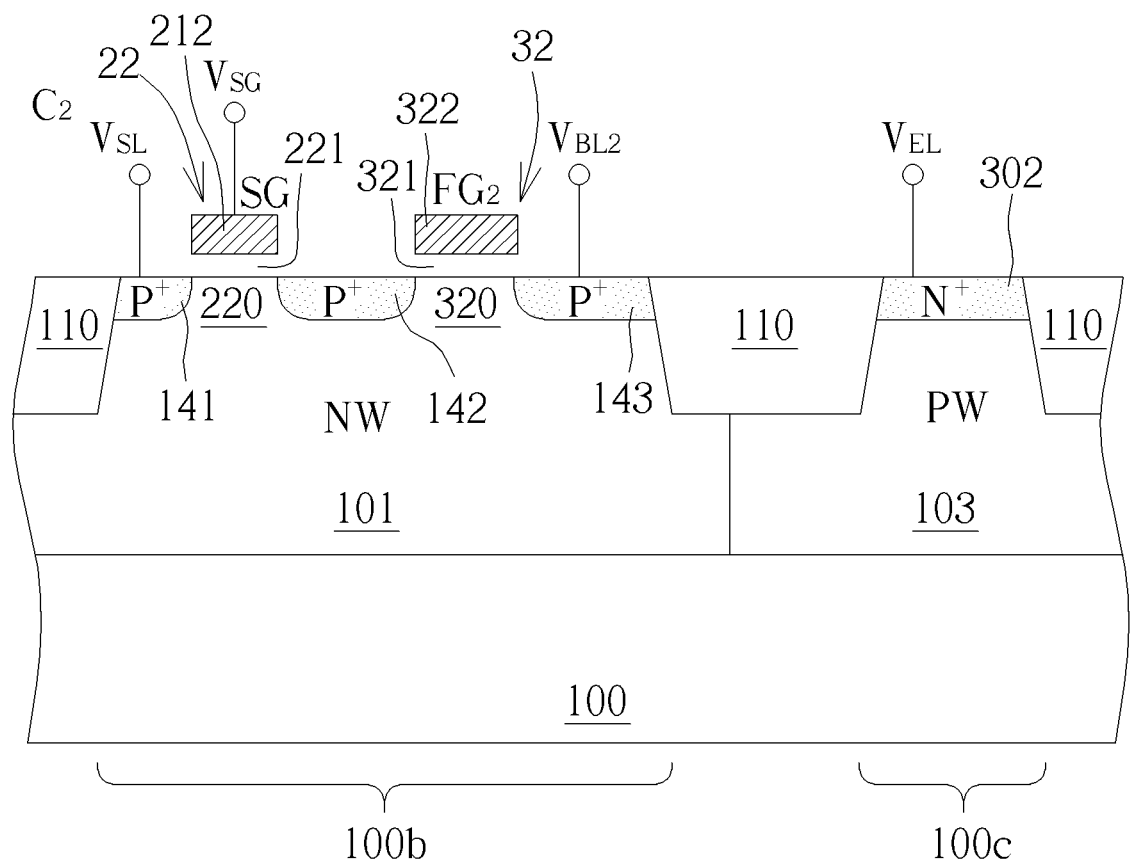
FIG. 4 is a schematic, cross-sectional view taken along line III-III' in FIG. 1

FIG. 1 is an exemplary layout diagram illustrating a single-poly non-volatile memory (NVM) unit according to an embodiment of the invention. FIG. 2 is a schematic, cross-sectional view taken along line I-I' in FIG. 1. FIG. 3 is a schematic, cross-sectional view taken along line II-II' in FIG. 1. FIG. 4 is a schematic, cross-sectional view taken along line III-III' in FIG. 1.

As shown in FIG. 1 to FIG. 4, the single-poly NVM unit 1 of the present invention is fabricated on a semiconductor substrate 100 of a first conductivity type, such as a P-type doped silicon substrate. At least three isolated oxide-define (OD) regions 100a, 100b, and 100c are provided on the semiconductor substrate 100 that are separated from each other by the isolation region 110. According to an embodiment of the present invention, the isolation region 110 may be a shallow trench isolation (STI) region, but is not limited thereto. According to an embodiment of the invention, the OD region 100a and the OD region 100b are parallel to each other and extend along the first direction $D_1$. The single-poly NVM unit 1 of the present invention is fabricated on the three OD regions 100a, 100b and 100c.

According to an embodiment of the present invention, the OD region 100a and the OD region 100b are formed in the ion well 101 of a second conductivity type, such as an N-type well (NW), and the OD region 100c is formed in the ion well 103 of the first conductivity type, such as P-type well (PW). According to an embodiment of the present invention, the depths of the ion wells 101 and 103 may be deeper than the bottom of the isolation region 110, but are not limited thereto. In operation, the N-type ion well 101 is applied with a well voltage $V_{NW}$ and the P-type ion well 103 is applied with a well voltage $V_{PW}$.

According to an embodiment of the invention, the single-poly NVM unit 1 of the invention has an asymmetric memory cell layout structure with respect to the imaginary axis S. According to an embodiment of the invention, the single-poly NVM unit 1 comprises a memory cell $C_1$ and a memory cell $C_2$, which exhibit an asymmetric memory cell layout structure with respect to the axis S.

According to an embodiment of the present invention, as shown in FIG. 1 and FIG. 2, the memory cell $C_1$ comprises a select transistor 21 and a floating gate transistor 31. The select transistor 21 is connected in series with the floating gate transistor 31 and is disposed together on the OD region 100a. According to an embodiment of the present invention, the select transistor 21 may be a PMOS transistor, including a source doping region 121 in the N-type ion well 101, a common doping region 122 spaced apart from the source doping region 121, a select gate channel region 210 between the source doping region 121 and the common doping region 122 and adjacent to the main surface of the semiconductor substrate 100, a select gate (SG) 212 overlying the select gate channel region 210, and a gate dielectric layer 211 between the select gate channel region 210 and the select gate 212.

As shown in FIG. 2, the source doping region 121 and the common doping region 122 may have the first conductivity type. For example, the source doping region 121 and the common doping region 122 may be $P^+$ doped regions. According to an embodiment of the invention, the source doping region 121 may be electrically coupled to a source line SL. In operation, the source doping region 121 is applied with a source line voltage $V_{SL}$ via the source line SL.

The floating gate transistor 31 comprises a floating gate (FG$_1$) 312 on the OD region 100a. According to an embodiment of the invention, the floating gate 312 is composed of a single layer of polysilicon. In accordance with an embodiment of the invention, the floating gate 312 is a single-poly gate, that is, no additional gate layers are stacked on the floating gate 312. The floating gate transistor 31 further comprises the common doping region 122 on one side of the floating gate 312, a drain doping region 123, a floating gate channel region 310 between the common doping region 122 and the drain doping region 123, and a gate dielectric layer 311 between the floating gate 312 and the floating gate channel region 310. Spacers (not shown) may be formed on opposite sidewalls of the floating gate 312. In operation, the drain doping region 123 is electrically coupled to a bit line BL$_1$, and a bit line voltage V$_{BL1}$ is applied via the bit line BL$_1$.

According to an embodiment of the invention, as shown in FIG. 1 and FIG. 4, the memory cell C$_2$ comprises a select transistor 22 and a floating gate transistor 32. The select transistor 22 and the floating gate transistor 32 are connected in series and are disposed together on the OD region 100b. According to an embodiment of the invention, the select transistor 22 may be a PMOS transistor, including a source doping region 141 in the N-type ion well 101, a common doping region 142 spaced apart from the source doping region 141, a select gate channel region 220 between the source doping region 141 and the common doping region 142 and adjacent to the main surface of the semiconductor substrate 100, a select gate 212 overlying the select gate channel region 220, and a gate dielectric layer 221 between the select gate channel region 220 and the select gate 212.

As shown in FIG. 4, the source doping region 141 and the common doping region 142 may have the first conductivity type. For example, the source doping region 141 and the common doping region 142 may be P$^+$ doped regions. According to an embodiment of the invention, the source doping region 141 may be electrically coupled to the source line SL. In operation, the source doping region 141 is applied with a source line voltage V$_{SL}$ via the source line SL.

According to an embodiment of the invention, the memory cells C$_1$ and C$_2$ may share the source doping region and/or the common doping region. For example, the source doping region 121 may be merged with the second source doping region 141 and/or the common doping region 122 may be merged with the common doping region 142.

The floating gate transistor 32 comprises a floating gate (FG$_2$) 322 on the OD region 100b. According to an embodiment of the invention, the floating gate 322 is composed of a single layer of polysilicon. According to an embodiment of the invention, the floating gate 322 is a single-poly gate, that is, no additional gate layers are stacked on the floating gate 322. The floating gate transistor 32 further comprises the common doping region 142 on one side of the floating gate 322, a drain doping region 143, a floating gate channel region 320 between the common doping region 142 and the drain doping region 143, and a gate dielectric layer 321 between the floating gate 322 and the floating gate channel region 320. Spacers (not shown) may be formed on opposite sidewalls of the floating gate 322. In operation, the drain doping region 143 is electrically coupled to a bit line BL$_2$, and a bit line voltage V$_{BL2}$ is applied via the bit line BL$_2$.

According to an embodiment of the invention, the memory cell C$_1$ shares the select gate 212 with the memory cell C$_2$, and the select gate 212 is applied with a select gate voltage V$_{SG}$ during operation. The select gate 212 and the floating gate 312 are arranged in parallel along the second direction D$_2$. The select gate 212 and the floating gate 322 are arranged in parallel along the second direction D$_2$. According to an embodiment of the invention, the select gate 212 may be an N$^+$ doped or P$^+$ doped single-poly gate, but is not limited thereto. Spacers (not shown) may be formed on opposite sidewalls of the select gate 212.

As can be seen from FIG. 1, the single-poly NVM unit 1 further comprises floating gate extensions 312a and 322a that extend continuously from the floating gates 312 and 322 to the OD region 100c, respectively. According to an embodiment of the present invention, the bit line BL$_1$ and the bit line BL$_2$ may extend along the first direction D$_1$, and the erase line EL and the source line SL may extend along the second direction D$_2$. For example, the erase line EL and the source line SL may be disposed in the first metal layer (M$_1$) of the metal interconnect structure, and the bit line BL$_1$ and the bit line BL$_2$ may be disposed in the second metal layer (M$_2$), which are electrically connected to the underlying doping region via suitably configured contact plugs.

As can be seen from FIG. 1, the floating gate extensions 312a and 322a cross the isolation region 110 between the OD region 100a and the OD region 100c and partially overlap the OD region 100c. The floating gate extensions 312a and 322a may have an elongated shape and extend along the first direction D$_1$ when viewed from above. According to an embodiment of the invention, the first direction D$_1$ is orthogonal to the second direction D$_2$.

As shown in FIG. 2, the heavily doped region 302 formed in the OD region 100c, such as N$^+$ doped region, can be used as an erase gate of the single-poly NVM unit 1. The heavily doped region 302 is adjacent to the floating gate extensions 312a and 322a. In the erase operation, the heavily doped region 302 is applied with an erase line voltage (V$_{EL}$) via the erase line EL. According to an embodiment of the present invention, the erase operation of the single-poly NVM unit 1 of the present invention involves the FN tunneling mechanism, which simultaneously removes electrons from the floating gates 312 and 322 via the floating gate extensions 312a and 322a.

According to an embodiment of the present invention, as shown in FIG. 3, the floating gate channel region 310 has a channel width W$_1$ and the floating gate channel region 320 has a channel width W$_2$ in the second direction D$_2$. According to an embodiment of the invention, the channel width W$_2$ is smaller than the channel width W$_1$. For example, W$_2$ may be 50 to 90% of W$_1$, but is not limited thereto. According to an embodiment of the present invention, the width (or referred to as channel length) of the floating gates 312 and 322 in the first direction D$_1$ may be substantially the same, but is not limited thereto. According to an embodiment of the invention, the overlapping area between the floating gate 312 and the OD region 100a is greater than the overlapping area between the floating gate 322 and the OD region 100b. According to an embodiment of the invention, the area of the OD region 100a is larger than the area of the OD region 100b. According to an embodiment of the invention, the area of the memory cell C$_1$ is larger than the area of the memory cell C$_2$.

According to an embodiment of the present invention, the floating gate transistors 31 and 32 are operated (e.g., programmed or erased) in a synchronized manner. For example, after the programming operation, the floating gate transistors 31 and 32 are both in a programmed state. After the erase operation, the floating gate transistors 31 and 32 are both in an erased state. Since the memory cell C$_1$ and the memory cell C$_2$ of the single-poly NVM unit 1 have an asymmetric memory cell layout structure with respect to the axis S, this makes the memory cell $C_1$ has a higher coupling ratio than the memory cell $C_2$. In other words, the floating gate 312 of the memory cell $C_1$ has a higher efficiency than the floating gate 322 of the memory cell $C_2$ during both the programming operation and the erase operation.

According to an embodiment of the present invention, the logic state (high/low) of the single-poly NVM unit 1 can be discriminated by comparing the read current ($I_{read}$) of the memory cell $C_1$ and the memory cell $C_2$. For example, if the read current of the memory cell $C_1$ ($I_{read1}$) is greater than the read current of the memory cell $C_2$ ($I_{read2}$), the single-poly NVM unit 1 is in a logic high state, and if the read current of the memory cell $C_1$ ($I_{read1}$) is smaller than the read current of the memory cell $C_2$ ($I_{read2}$), the single-poly NVM unit 1 is in a logic low state. However, those skilled in the art can also define the comparison of the read current in another way. For example, if the read current of the memory cell $C_1$ ($I_{read1}$) is greater than the read current of the memory cell $C_2$ ($I_{read2}$), the single-poly NVM unit 1 is in the logic low state, and if the read current of the memory cell $C_1$ ($I_{read1}$) is smaller than the read current of the memory cell $C_2$ ($I_{read2}$), the single-poly NVM unit 1 is in a logic high state. It should be noted that the current difference between the read current of the memory cell $C_1$ ($I_{read1}$) and the read current of the memory cell $C_2$ ($I_{read2}$) needs to be sufficient for the sense amplifier to detect and discriminate.

FIG. 5 illustrates an operational condition table for programming, erasing or reading the single-poly NVM unit 1 of FIG. 1 in accordance with an embodiment of the present invention.

For example, during the program (PGM) operation of the NVM unit 1, the erase line voltage $V_{EL}$ supplied to the heavily doped region 302 is 0V to $V_{DD}$. The select gate voltage $V_{SG}$ supplied to the select gate 212 of the select transistors 21 and 22 is 0V to $V_{DD}$. The source line voltage $V_{SL}$ supplied to the source doping regions 121 and 141 of the select transistors 21 and 22 is $V_{PP}$. The bit line voltages $V_{BL1}$ and $V_{BL2}$ supplied to the bit lines $BL_1$ and $BL_2$ are 0V ($V_{BL1}=V_{BL2}=0V$). The well voltage $V_{NW}$ supplied to the N-type ion well 101 is $V_{PP}$, and the well voltage $V_{PW}$ supplied to the P-type ion well 103 is 0V. Under these conditions, electrons are injected into the floating gates 312 and 322 by a channel hot electron (CHE) mechanism, and the memory cell $C_1$ and the memory cell $C_2$ are programmed concurrently. $V_{PP}$ refers to program or write voltage, and $V_{EE}$ refers to erase voltage.

During the erase (ERS) operation of the NVM unit 1, the erase line voltage $V_{EL}$ supplied to the heavily doped region 302 is 0V to $V_{EE}$ ($0V<V_{DD}<V_{EE}$). The select gate voltage $V_{SG}$ supplied to the select gate 212 of the select transistors 21 and 22 is 0V. The source line voltage $V_{SL}$ supplied to the source doping regions 121 and 141 of the select transistors 21 and 22 is 0V. The bit line voltages $V_{BL1}$ and $V_{BL2}$ supplied to the bit lines $BL_1$ and $BL_2$ are 0V ($V_{BL1}=V_{BL2}=0V$). The well voltage $V_{NW}$ supplied to the N-type ion well 101 is 0V, and the well voltage $V_{PW}$ supplied to the P-type ion well 103 is 0V. Under these conditions, electrons are pulled out from the floating gates 312 and 322 by the FN tunneling mechanism, and the memory cell $C_1$ and the memory cell $C_2$ are erased concurrently. Since the non-volatile memory structure is a single-bit multi-cell structure, the bit failure rate of the memory array can be greatly reduced.

During the negative erase operation of the NVM unit 1, the erase line voltage $V_{EL}$ supplied to the heavily doped region 302 is 0V to $V_{EE}$ ($0V<V_{DD}<V_{EE}$). The select gate voltage $V_{SG}$ supplied to the select gate 212 of the select transistors 21 and 22 is 0V to ($V_{BB}$–Vt). The source line voltage $V_{SL}$ supplied to the source doping regions 121 and 141 of the select transistors 21 and 22 is $V_{BB}$. The bit line voltages $V_{BL1}$ and $V_{BL2}$ supplied to the bit lines $BL_1$ and $BL_2$ are $V_{BB}$, where $V_{BB}$ is a negative voltage. The well voltage $V_{NW}$ supplied to the N-type ion well 101 is 0V, and the well voltage $V_{PW}$ supplied to the P-type ion well 103 is 0V.

During the read operation of the NVM unit 1, the erase line voltage $V_{EL}$ supplied to the heavily doped region 302 is 0V. The select gate voltage $V_{SG}$ supplied to the select gate 212 of the select transistors 21 and 22 is 0V. The source line voltage $V_{SL}$ supplied to the source doping regions 121 and 141 of the select transistors 21 and 22 is $V_{read}$ ($V_{read}<V_{DD}$). The bit line voltages $V_{BL1}$ and $V_{BL2}$ supplied to the bit lines $BL_1$ and $BL_2$ are 0V ($V_{BL1}=V_{BL2}=0V$). The well voltage $V_{NW}$ supplied to the N-type ion well 101 is $V_{read}$ ($V_{read}<V_{DD}$), and the well voltage $V_{PW}$ supplied to the P-type ion well 103 is 0V.

In summary, structurally, a single-poly NVM unit 1 of the present invention comprises: a semiconductor substrate 100 having a first conductivity type (e.g., P-type); three oxide-define (OD) regions disposed on the semiconductor substrate 100 and separated from each other by an isolation region 110, including a first OD region 100a, a second OD region 100b, and a third OD region 100c. The first OD region 100a and the second OD region 100b are formed in a first ion well 101, and the first ion well 101 has a second conductivity type (for example, N type). A first memory cell $C_1$ is disposed on the first OD region 100a, and a second memory cell $C_2$ is disposed on the second OD region 100b. The first memory cell $C_1$ and the second memory cell $C_2$ exhibit an asymmetric memory cell layout structure with respect to an axis S. An erase gate (i.e. the heavily doped region 302) is provided in the third OD region 100c.

According to an embodiment of the invention, the first OD region 100a and the second OD region 100b are parallel to each other and extend along a first direction $D_1$. The third OD region 100c extends along a second direction $D_2$. The third OD region 100c is formed in a second ion well 103, and the second ion well 103 has the first conductivity type (e.g., P-type).

According to an embodiment of the invention, the first memory cell $C_1$ comprises a first select transistor 21 and a first floating gate transistor 31 connected in series with each other. The first select transistor 21 and the first floating gate transistor 31 are disposed on the first OD region 100a. The second memory cell $C_2$ comprises a second select transistor 22 and a second floating gate transistor 32 connected in series with each other. The second select transistor 22 and the second floating gate transistor 32 are disposed on the second OD region 100b.

According to an embodiment of the invention, the first select transistor 21 comprises a first source doping region 121, a first common doping region 122, and a select gate 212, wherein the first source doping region 121 and the first common doping region 122 have the first conductivity type, wherein the first floating gate transistor 31 comprises the first common doping region 122, a first drain doping region 123, and a first floating gate 312.

According to an embodiment of the invention, the second select transistor 22 comprises a second source doping region 141, a second common doping region 142, and the select gate 212, wherein the second source doping region 141 and the second common doping region 142 have the first conductivity type, wherein the second floating gate transistor 32 comprises the second common doping region 142, a second drain doping region 143, and a second floating gate 322.

According to an embodiment of the present invention, as shown in FIG. 3, the first floating gate 312 has a first channel width $W_1$ in the second direction $D_2$, and the second floating gate 322 has a second channel width $W_2$ in the second direction $D_2$. The second channel width $W_2$ is smaller than the first channel width $W_1$.

Figure 6:
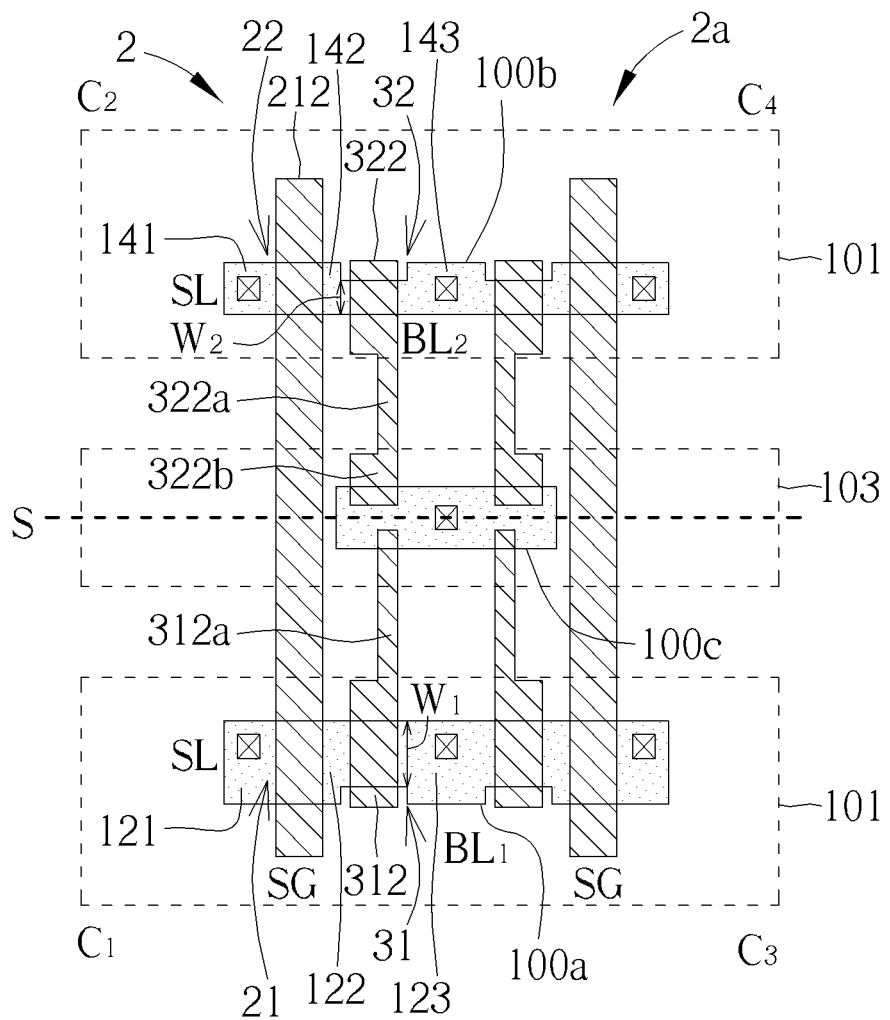
FIG. 6 is a schematic diagram showing the layout of a single-poly NVM unit according to another embodiment of the present invention.

FIG. 6 is a schematic diagram showing the layout of a single-poly NVM unit according to another embodiment of the present invention, wherein the same regions, layers or elements are still denoted by the same numerical numerals. FIG. 6 illustrates two single-poly NVM units 2 and 2a, wherein the single-poly NVM unit 2 comprises a memory cell $C_1$ and a memory cell $C_2$, and the single-poly NVM unit 2a comprises a memory cell $C_3$ and a memory cell $C_4$. The memory cells $C_1$ to $C_4$ share one single OD region 100c. The following discussion is only for the single-poly NVM unit 2. Similarly, the single-poly NVM unit 2 is fabricated on the semiconductor substrate 100 of a first conductivity type, such as a P-type silicon substrate. At least three isolated oxide-define (OD) regions 100a, 100b, and 100c are provided on the semiconductor substrate 100 that are separated from each other by the isolation regions 110. According to an embodiment of the present invention, the isolation region 110 may be a shallow trench isolation (STI) region, but is not limited thereto. According to an embodiment of the present invention, the OD regions 100a to 100c are parallel to each other and extend along the second direction $D_2$, and the OD region 100c is interposed between the OD region 100a and the OD region 100b. The single-poly NVM unit 2 of the present invention is fabricated on three OD regions 100a, 100b and 100c.

According to an embodiment of the present invention, the OD region 100a and the OD region 100b are formed in the ion well 101 of the second conductivity type, such as an N-type ion well, and the OD region 100c is formed in the ion well 103 of the first conductivity type, such as a P-type ion well. According to an embodiment of the present invention, the depths of the ion wells 101 and 103 may be deeper than the bottom of the isolation region 110, but are not limited thereto. In operation, the N-type ion well 101 is applied with a well voltage $V_{NW}$ and the P-type ion well 103 is applied with a well voltage $V_{PW}$.

According to an embodiment of the invention, the single-poly NVM unit 2 of the invention has an asymmetrical memory cell layout structure with respect to an axis S extending in the second direction $D_2$. According to an embodiment of the invention, the single-poly NVM unit 2 comprises a memory cell $C_1$ and a memory cell $C_2$, which exhibit an asymmetric memory cell layout structure with respect to the axis S.

According to an embodiment of the invention, the memory cell $C_1$ comprises a select transistor 21 and a floating gate transistor 31. The select transistor 21 and the floating gate transistor 31 are connected in series with each other, which are disposed together on the OD region 100a. According to an embodiment of the present invention, the select transistor 21 may be a PMOS transistor, including a source doping region 121 in the N-type ion well 101, a common doping region 122 spaced apart from the source doping region 121, a select gate channel region (not explicitly shown in FIG. 6) between the source doping region 121 and the common doping region 122 and adjacent to the main surface of the semiconductor substrate 100, a select gate (SG) 212 overlying the select gate channel region, and a gate dielectric layer (not explicitly shown in FIG. 6) between the select gate 212 and the select gate channel region.

The source doping region 121 and the common doping region 122 may have the first conductivity type. For example, the source doping region 121 and the common doping region 122 may be $P^+$ doped regions. According to an embodiment of the invention, the source doping region 121 may be electrically coupled to the source line SL. In operation, the source doping region 121 is applied with a source line voltage $V_{SL}$ via the source line SL.

The floating gate transistor 31 comprises a floating gate 312 on the OD region 100a. According to an embodiment of the invention, the floating gate 312 is composed of a single layer of polysilicon. In accordance with an embodiment of the invention, the floating gate 312 is a single-poly gate, that is, no additional gate layers are stacked on the floating gate 312. The floating gate transistor 31 further comprises a common doping region 122 on one side of the floating gate 312, a drain doping region 123, and a floating gate channel region (not explicitly shown in FIG. 6) between the common doping region 122 and the drain doping region 123, and a gate dielectric layer (not explicitly shown in FIG. 6) between the floating gate 312 and the floating gate channel region. In operation, the drain doping region 123 is electrically coupled to the a bit line $BL_1$, and a bit line voltage $V_{BL1}$ is applied via the bit line $BL_1$.

According to an embodiment of the invention, memory cell $C_2$ comprises a select transistor 22 and a floating gate transistor 32. The select transistor 22 and the floating gate transistor 32 are connected in series with each other, which are disposed together on the OD region 100b. According to an embodiment of the invention, the select transistor 22 may be a PMOS transistor, including a source doping region 141 in the N-type ion well 101, a common doping region 142 spaced apart from the source doping region 141, and a select gate channel region (not explicitly shown in FIG. 6) between the source doping region 141 and the common doping region 142 and adjacent to the main surface of the semiconductor substrate 100, a select gate 212 overlying the select gate channel region, and a gate dielectric layer (not explicitly shown in FIG. 6) between the select gate 212 and the select gate channel region.

The source doping region 141 and the common doping region 142 may have the first conductivity type. For example, the source doping region 141 and the common doping region 142 may be $P^+$ doped regions. According to an embodiment of the invention, the source doping region 141 may be electrically coupled to the source line SL. In operation, the source doping region 141 is applied with a source line voltage $V_{SL}$ via the source line SL.

The floating gate transistor 32 comprises a floating gate 322 on the OD region 100b. According to an embodiment of the invention, the floating gate 322 is composed of a single layer of polysilicon. According to an embodiment of the invention, the floating gate 322 is a single-poly gate, that is, no additional gate layers are stacked on the floating gate 322. The floating gate transistor 32 further comprises the common doping region 142 on one side of the floating gate 322, a drain doping region 143, a floating gate channel region (not explicitly shown in FIG. 6) between the common doping region 142 and the drain doping region 143, and a gate dielectric layer (not explicitly shown in FIG. 6) between the floating gate 322 and the floating gate channel region. In operation, the drain doping region 123 is electrically coupled to the one bit line $BL_2$, and a one bit line voltage $V_{BL2}$ is applied via the bit line $BL_2$.

According to an embodiment of the invention, the memory cell $C_1$ shares the select gate 212 with the memory cell $C_2$, and the select gate 212 is applied with a select gate voltage $V_{SG}$ during operation. The select gate 212 and the floating gate 312 are disposed in parallel along the first direction D1. The select gate 212 and the floating gate 322 are arranged in parallel along the first direction $D_1$. According to an embodiment of the invention, the select gate 212 may be an $N^+$ doped or $P^+$ doped single-poly gate, but is not limited thereto.

The single-poly NVM unit 2 also comprises floating gate extensions 312a and 322a that extend continuously from the floating gates 312 and 322 to the OD region 100c, respectively, wherein the OD region 100c is electrically coupled to an erase line. The floating gate extensions 312a and 322a span the isolation region 110 between the OD region 100a and the OD region 100c and partially overlap the OD region 100c. The floating gate extensions 312a and 322a may have an elongated shape and extend along the first direction $D_1$ when viewed from above. According to an embodiment of the invention, the first direction $D_1$ is orthogonal to the second direction $D_2$.

In accordance with an embodiment of the invention, the floating gate extension 322a has an enlarged end portion 322b which results in a higher coupling ratio of the floating gate extension 322a to the OD region 100c.

According to an embodiment of the invention, the heavily doped region 302, such as $N^+$ doped region, formed within the OD region 100c can be used as an erase gate for the single-poly NVM unit 2. The heavily doped region 302 is adjacent to the floating gate extensions 312a and 322a. In the erase operation, the heavily doped region 302 is applied with an erase line voltage ($V_{EL}$) via the erase line.

In accordance with an embodiment of the invention, as shown in FIG. 6, the floating gate channel region 310 has a channel width $W_1$ and the floating gate channel region 320 has a channel width $W_2$. According to an embodiment of the invention, the channel width $W_2$ is smaller than the channel width $W_1$. For example, $W_2$ may be 50 to 90% of $W_1$, but is not limited thereto. According to an embodiment of the present invention, the widths (or referred to as channel length) of the floating gates 312 and 322 in the second direction $D_2$ may be substantially the same, but is not limited thereto. According to an embodiment of the invention, the overlapping area between the floating gate 312 and the OD region 100a is greater than the overlapping area between the floating gate 322 and the OD region 100b. According to an embodiment of the invention, the area of the OD area 100a is larger than the area of the OD area 100b. According to an embodiment of the invention, the area of the memory cell $C_1$ is larger than the area of the memory cell $C_2$.

In accordance with an embodiment of the invention, the floating gate transistors 31 and 32 are operated (e.g., programmed or erased) in a synchronized manner. For example, after the program operation, the floating gate transistors 31 and 32 are both in a programmed state. After the erase operation, the floating gate transistors 31 and 32 are both in an erased state. Since the memory cell $C_1$ and the memory cell $C_2$ of the single-poly NVM unit 2 have an asymmetric memory cell layout structure with respect to the axis S, this makes the memory cell $C_1$ has a higher coupling ratio than the memory cell $C_2$. In other words, the memory cell $C_1$ has a higher efficiency than the memory cell $C_2$ in both the program operation and the erase operation.

Figure 7:
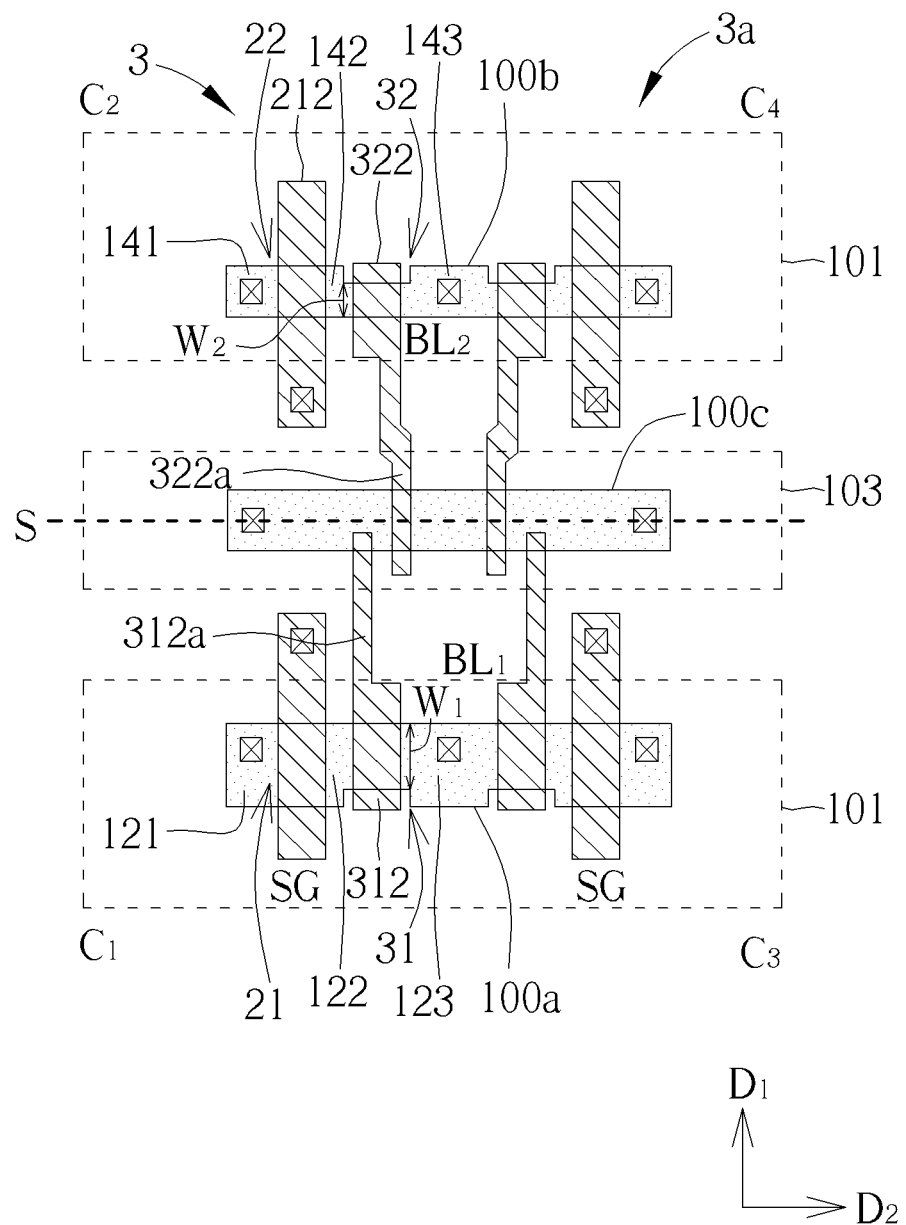
FIG. 7 is a schematic diagram showing the layout of a single-poly NVM unit according to another embodiment of the present invention.

FIG. 7 is a schematic diagram showing the layout of a single-poly NVM unit according to another embodiment of the present invention, wherein the same regions, layers or elements are still denoted by the same numerical numerals. FIG. 7 illustrates two single-poly NVM units 3 and 3a, wherein the single-poly NVM unit 3 comprises a memory cell $C_1$ and a memory cell $C_2$, and the single-poly NVM unit 3a comprises a memory cell $C_3$ and a memory cell $C_4$. The memory cells $C_1$ to $C_4$ share one single OD region 100c. The single-poly NVM unit 3 comprises floating gate extensions 312a and 322a that extend continuously from the floating gates 312 and 322 to the OD region 100c, respectively, wherein the OD region 100c is electrically coupled to an erase line. The floating gate extensions 312a and 322a span the isolation region 110 between the OD region 100a and the OD region 100c and overlap the OD region 100c. The floating gate extensions 312a and 322a may have an elongated shape and extend along the first direction $D_1$ when viewed from above. According to an embodiment of the invention, the first direction $D_1$ is orthogonal to the second direction $D_2$.

The difference between the embodiment shown in FIG. 7 and FIG. 6 is only that the floating gate extension 312a of the memory cell $C_1$ partially overlaps the OD region 100c, does not cross the OD region 100c, and the floating gate extension 322a of the memory cell $C_2$ spans the OD region 100c, which results in a higher coupling ratio of the floating gate extension 322a to the OD region 100c.

The present invention has at least the following advantages: (1) The initial state can be freely read after the erase operation without going through a wake-up program operation; (2) The memory unit does not need to cover the reference current variation, so that the size of the memory cell can be further reduced; (3) The memory unit can maintain a sufficient sensing window; (4) The memory unit has improved data retention; (5) The operating voltage of the program/erase operation can be reduced; and (6) Faster access time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-poly non-volatile memory (NVM) unit, comprising:
    a semiconductor substrate having a first conductivity type;
    a first oxide define region (OD) region, a second OD region, and a third OD region disposed on the semiconductor substrate and separated from each other by an isolation region, wherein the first OD region and the second OD region are formed in a first well, and the first well has a second conductivity type;
    a first memory cell disposed on the first OD region;
    a second memory cell disposed on the second OD region, wherein the first memory cell and the second memory cell exhibit an asymmetric memory cell layout structure with respect to an axis; and
    an erase gate disposed in the third OD region.

2. The single-poly NVM unit according to claim 1, wherein the first OD region and the second OD region are parallel to each other and extend along a first direction, and the third OD region extends along a second direction.

3. The single-poly NVM unit according to claim 1, wherein the third OD region is formed in a second well and the second well has the first conductivity type.

4. The single-poly NVM unit according to claim 1, wherein the first conductivity type is P type and the second conductivity type is N type.

5. The single-poly NVM unit according to claim 2, wherein the first memory cell comprises a first select transistor and a first floating gate transistor connected in series with each other, which are disposed on the first OD region, wherein the second memory cell comprises a second select transistor and a second floating gate transistor connected in series with each other, which are disposed on the second OD region.

6. The single-poly NVM unit according to claim 5, wherein the first select transistor comprises a first source doping region, a first common doping region, and a select gate, wherein the first source doping region and the first common doping region have the first conductivity type, wherein the first floating gate transistor comprises the first common doping region, a first drain doping region, and a first floating gate.

7. The single-poly NVM unit according to claim 6, wherein the second select transistor comprises a second source doping region, a second common doping region, and the select gate, wherein the second source doping region and the second common doping region have the first conductivity type, wherein the second floating gate transistor comprises the second common doping region, a second drain doping region, and a second floating gate.

8. The single-poly NVM unit according to claim 7, wherein the first source doping region is merged with the second source doping region and/or or the first common doping region is merged with the second common doping region.

9. The single-poly NVM unit according to claim 7, wherein the first floating gate has a first channel width in the second direction, and the second floating gate has a second channel width in the second direction, wherein the second channel width is smaller than the first channel width.

10. The single-poly NVM unit according to claim 9, wherein the second channel width is 50 to 90% of the first channel width.

11. The single-poly NVM unit according to claim 7, wherein an overlapping area between the first floating gate and the first OD region is greater than an overlapping area between the second floating gate and the second OD region.

12. The single-poly NVM unit according to claim 7, wherein an area of the first OD region is larger than an area of the second OD region.

13. The single-poly NVM unit according to claim 7, wherein an area of the first memory cell is larger than an area of the second memory cell.

14. The single-poly NVM unit according to claim 7, wherein the floating gate of the first memory cell has a higher coupling ratio than that of the second memory cell.

15. The single-poly NVM unit according to claim 7, wherein the first memory cell further comprises a first floating gate extension extending from the first floating gate and crossing the isolation region between the first OD region and the third OD region, wherein the first floating gate extension partially overlaps the third OD region.

16. The single-poly NVM unit according to claim 15, wherein the second memory cell further comprises a second floating gate extension extending from the second floating gate and crossing the isolation region between the first OD region and the third OD region, wherein the second floating gate extension partially overlaps the third OD region.

17. The single-poly NVM unit according to claim 16, wherein the erase gate is electrically coupled to an erase line.

18. The single-poly NVM unit according to claim 16, wherein the erase gate comprises a heavily doped region having the second conductivity type disposed in the third OD region and is adjacent to the first floating gate extension and the second floating gate extension.

19. The single-poly NVM unit according to claim 7, wherein the first source doping region and the second source doping region are electrically coupled to a source line.

20. The single-poly NVM unit according to claim 19, wherein the first drain doping region is electrically coupled to a first bit line and the second drain doping region is electrically coupled to a second bit line.

21. The single-poly NVM unit according to claim 1, wherein the first memory cell and the second memory cell are programmed or erased in a synchronized manner.

22. The single-poly NVM unit according to claim 1, wherein the first OD region, the second OD region, and the third OD region are parallel to each other and extend along a first direction.

23. The single-poly NVM unit according to claim 22, wherein the first memory cell comprises a first floating gate transistor comprising a first floating gate extension extending from the first OD region to the third OD region, wherein the second memory cell comprises a second floating gate transistor comprising a second floating gate extension extending from the second OD region to the third OD region, wherein the second floating gate extension further comprises an enlarged end portion.

24. The single-poly NVM unit according to claim 22, wherein the first memory cell comprises a first floating gate transistor comprising a first floating gate extension extending from the first OD region to the third OD region, wherein the second memory cell comprises a second floating gate transistor comprising a second floating gate extension extending from the second OD region to the third OD region, wherein the first floating gate extension partially overlaps the third OD region, but not crossing the third OD region, and the second floating gate extension spans the third OD region.

25. A method for operating the single-poly NVM unit according to claim 1, comprising:
reading read currents ($I_{read}$) of the first memory cell and the second memory cell, respectively, to discriminate a programmed state or an erased state of the single-poly NVM unit.

26. The method according to claim 25, wherein when read current of the first memory cell ($T_{read1}$) is greater than read current of the second memory cell ($I_{read2}$), then the single-poly NVM unit is in a programmed state, and wherein when read current of the first memory cell ($I_{read1}$) is smaller than read current of the second memory cell ($I_{read2}$), the single-poly NVM unit is in the erased state.

* * * * *